(12) United States Patent
Schiltz et al.

(10) Patent No.: US 6,387,808 B1
(45) Date of Patent: May 14, 2002

(54) METHOD OF CORRECTING TOPOGRAPHICAL EFFECTS ON A MICRO-ELECTRONIC SUBSTRATE

(75) Inventors: André Schiltz, Saint-Ismier; Maryse Paoli; Patrick Schiavone, both of Villard Bonnot; Alain Prola, Grenoble, all of (FR)

(73) Assignee: France Telecom, Paris (FR)

( * ) Notice: Subject to any disclaimer, the term of this patent is extended or adjusted under 35 U.S.C. 154(b) by 26 days.

(21) Appl. No.: 09/620,896

(22) Filed: Jul. 21, 2000

(30) Foreign Application Priority Data

Jul. 22, 1999 (FR) .............................. 99 09521

(51) Int. Cl.[7] .............................. H01L 21/302
(52) U.S. Cl. ................ 438/689; 438/690; 438/691; 438/692; 438/710
(58) Field of Search ................ 438/689, 690, 438/691, 692, 710

(56) References Cited

U.S. PATENT DOCUMENTS

| | | | |
|---|---|---|---|
| 5,580,826 A | | 12/1996 | Matsubara et al. |
| 5,925,494 A | * | 7/1999 | Horn .............................. 427/488 |
| 6,174,449 B1 | * | 1/2001 | Alwan et al. .................. 216/42 |
| 6,207,555 B1 | * | 3/2001 | Ross .............................. 438/618 |
| 6,258,514 B1 | * | 7/2001 | Montgomery ............... 430/315 |
| 6,316,363 B1 | * | 11/2001 | Blalock et al. ............. 156/345 |

OTHER PUBLICATIONS

Schlitz et al: "Two Layer resist etch–back planarization process coupled to chemical mechanical polishing for sub–0.18 micron shallow trench isolation technology" Proceedings of the SPIE: Emerging Lithographic Technologies III, vol. 3676, Mar. 15–17, 1999, pp. 802–8111.

* cited by examiner

Primary Examiner—Felisa Hiteshew
Assistant Examiner—Vanessa Perez-Ramos
(74) Attorney, Agent, or Firm—Blakely Sokoloff Taylor & Zafman

(57) ABSTRACT

A method of correcting topographical effects on a microelectronic substrate, the method comprising the steps consisting in depositing a layer of resin on the structure to be planarized having topography in relief surrounded by isolation zones, and subjecting said resin layer in its zones superposed on underlying zones of high topographical density to photolithography by means of a mask possessing a standard mesh without any one-to-one coincidence with the underlying topography.

7 Claims, 3 Drawing Sheets

METHOD OF CORRECTING TOPOGRAPHICAL EFFECTS ON A MICRO-ELECTRONIC SUBSTRATE

The invention relates to the field of manufacturing semi-conductors in the form of integrated circuits.

It relates to photolithographic techniques and to techniques for obtaining planeness as used in the manufacture of integrated circuits. More particularly, the present invention relates to techniques which make it possible to obtain planeness of substrates in advanced lithography, i.e. to mechanical and chemical polishing and planarization.

BACKGROUND OF THE INVENTION

In the steps of manufacturing an integrated circuit, layers of semiconductive, insulating, or metallic materials need to be deposited and then to be subjected to lithography and etching. These layers can be of various topographies, i.e. they can be plane or in relief.

In conventional manner, lithography takes place by depositing a layer of photosensitive resin on a layer that is to be subjected to lithography, and then sensitizing certain zones only of the resin which are then developed in a developer that is adapted to the chemical nature of the resin, thereby revealing specific zones of the layer for lithography.

The lithography step, like the steps of depositing the various materials, takes place with much better results when the underlying surface is plane. However, during manufacture of integrated circuits with successive operations of deposition and etching being performed, the unevenness of substrate topography increases to such an extent as to cause the implementation of certain steps to become critical.

That is why "planarization" techniques are used to make the topography planar from the beginning of integrated circuit manufacture.

Those techniques can comprise so-called "etch-back" planarization which consists in depositing a layer of resin which flattens the relief, with planeness being transferred to the substrate by plasma etching or by mechanical and chemical polishing which consists in abrading a thick layer of insulating or conductive material deposited on the substrate.

Obtaining planeness is vital during the initial steps of manufacturing integrated circuits and in particular when manufacturing transistor-isolating zones.

At present, isolating zones are generally made plane by mechanical and chemical polishing.

Nevertheless, that technique encounters certain limitations associated with the ever decreasing dimensions used for manufacturing circuits of ever increasing density. One method of improving the performance of mechanical and chemical polishing is to use a pre-planarization technique by back-masking and etching.

Those known planarization techniques are described below.

Over the last few years, the mechanical and chemical polishing technique has generally replaced other planarization techniques because of its better long distance uniformity and its better rate of throughput.

The principle of the mechanical and chemical polishing technique is to abrade layers (generally of silica and more recently of copper) by mechanical rubbing with an abrasive cloth (using rotary motion or movement in translation) under a certain pressure and in the presence of a solution that is chemically aggressive relative to the layer to be abraded.

The combined chemical and mechanical abrasion enables abrasion speed to be high and enables the anisotropic nature of the attack to be adjusted over the entire surface of the wafer with good overall uniformity (chemical attack is more isotropic, while mechanical attack is more directional).

Nevertheless, although uniformity is good at very long range, the mechanical and chemical polishing technique, like the other planarization techniques, remains sensitive to topographical density. Sensitivity to topographic density is of the order of 100 microns for techniques making use of planarization obtained by depositing a layer of resin and it is of millimeter order for the mechanical and chemical polishing technique. As a consequence, in chips where there are very dense zones that are a few millimeters wide separated by zones that are less dense, the so-called "dishing" effect is observed which is manifested by the less dense zones (or those which offer little resistance to abrasion) becoming dished or by the denser zones (which withstand abrasion) bulging, as shown in accompanying FIG. 1.

In FIG. 1, reference 10 designates a semiconductive substrate having zones 12 of lower density and zones 14 of greater density, and 30 represents a cloth used for mechanical polishing, in this case by rotating relative to the substrate 10 about an axis O—O perpendicular to the mean plane of the substrate 10.

Because of this density-related effect, the mechanical-and chemical polishing technique is restricted to planarizing structures with dimensions greater than 0.3 µm.

For smaller technologies, the mechanical and chemical polishing technique is preceded by pre-planarization by back-masking and etching all of the positive topographical elements as shown in FIGS. 2a to 2c.

More precisely, in these FIGS. 2a, 2b, and 2c, 10 designates a substrate having various layers of semiconductive, insulating, or metallic material, depending on the desired function, with a top layer 16, e.g. an oxide layer, that initially presents markedly uneven topography, as can be seen in FIG. 2a, i.e. it has portions in relief.

As shown in FIG. 2a, a layer of photosensitive resin 20 is deposited on the layer 16.

Then a mask 22 is superposed on said photosensitive layer 20. The mask 22 has openings 24 of a shape that matches the projections in relief of the layer 16 and that are superimposed respectively over them.

A flux of radiation 26 to which the resin 20 is sensitive, e.g. ultraviolet radiation, is applied to the resin layer through the mask 22.

Then the layer of resin 20 is developed.

This gives rise, as shown in FIG. 2b, to elements 21 of the resin layer 20 remaining on the top layer 16 of the substrate between the marked portions in relief of said layer 16.

Mechanical polishing is then performed using a cloth 30, as shown in FIG. 2c.

That known technique as shown in FIGS. 2a, 2b, and 2c is generally referred to as "pre-planarization by back-masking and direct etching of lateral isolating structures by shallow trenches prior to mechanical and chemical polishing", with such Shallow Trench Isolating structures also being referred to by the initials STI.

The prior techniques described above are restricted to 0.3 micron technologies when the mechanical and chemical polishing technique shown in FIG. 1 is used on its own.

They are limited to 0.25 micron technologies when used in conjunction with the technique of pre-planarization by back-masking and etching of the positive topographical element as shown in FIG. 2.

The latter technique is limited by problems of potential misalignment between the mask 22 and the topography of the underlying semiconductor device, which problems are inherent to photolithography. The misalignment can be of the order of 0.1 µm, and it can lead to undesirable over-etching of insulating zones when the mask 22 is offset.

For technologies smaller than or equal to 0.18 microns, another technique is therefore required.

A technique of pre-planarization by depositing two successive layers of resin is sometimes used. That technique is known as two-layer planarization or TLP. A description can be found in document [1]. That technique is shown diagrammatically in FIGS. 3a to 3d. FIG. 3a shows a substrate 10 having various layers of semiconductive, insulating, or metallic material, including a top layer 16 that initially presents markedly uneven topography (see FIG. 3a).

A first layer of photosensitive resin 20 is deposited and lithographed with a special back-mask 22 having its openings 24 of reduced size (see FIG. 3a) and consequently giving rise to patterns of reduced size in the resulting resin 21 that is used to mask the isolating zones on the substrate 10 (see FIG. 3b).

This means that centering of the mask is insensitive to misalignment and allows the resin to flow thermally into the isolating recesses (see FIG. 3c). Heat treatment also serves to cure the first layer 20, thereby making it insoluble and enabling a second layer 28 to be deposited.

The second layer 28 planarizes the residual undulations and enables an almost plane surface to be obtained over the entire surface area, as shown in FIG. 3c.

After both layers of resin have been deposited, the planeness of the surface is transferred to the substrate by plasma etching as represented in FIGS. 3c and 3d under conditions such that the resin 20, 28, and the underlying oxide layer 16 are all etched at the same speed. Etching is stopped 100 nanometers above the active zone layer, e.g. a nitride layer, and the wafers are transferred to a mechanical and chemical polishing station where planarization is continued and stopped in the nitride layer so as to obtain a plane structure with isolation zones embedded in the silicon.

Nevertheless, that technique is still sensitive to topographical density since the zones of the substrate having very small patterns are excluded because of the reduction in the size of the patterns in the resin (see FIG. 3b) due to the reduction in the size of the openings 24 in the mask 22. If these zones are large, they give rise to a phenomenon similar to the dishing effect encountered in pure mechanical and chemical polishing, as shown in FIGS. 4a to 4e.

In FIGS. 4a to 4e:

FIG. 4a shows the substrate 10 having the layer in relief 16 prior to the planarization process;

FIG. 4b shows the structure after deposition and photolithography of the first layer 20;

FIG. 4c shows the structure after the second layer 28 has been deposited and annealed;

FIG. 4d shows the structure after plasma planarization (transfer of the plane profile); and FIG. 4e shows the structure after mechanical and chemical polishing.

In FIG. 4e, there can be seen a dimensional difference between dense zones (smaller thickness) and other zones, as a result in particular of the absence of any traces of the first layer 20 prior to deposition of the second layer 28 (and thus prior to plasma etching and mechanical and chemical polishing) over the dense zones.

OBJECTS AND SUMMARY OF THE INVENTION

In this context, the object of the present invention is to propose novel means enabling the planeness of semiconductor devices to be improved during the process of manufacturing them.

The present invention achieves this object by a method of correcting topographical effects on a micro-electronic substrate, the method comprising the steps consisting in:

i) depositing a first layer of resin on the structure to be planarized that has topography in relief surrounded by isolation zones;

ii) subjecting said resin layer in its zones superposed over underlying zones of low topographical density to photolithography by means of a mask imposing resin patterns of a size smaller than the underlying isolation zones to be masked;

iii) subjecting the resin layer in its zones superposed on underlying zones of high topographical density to photolithography through a mask possessing a standard mesh without any one-to-one coincidence with the underlying topography wherein said step iii) of photolithography through a mask possessing a standard mesh consists in adjusting the insolation to obtain optimum filling of large topographically dense zones;

iv) subjecting the first layer of resin as photolithographed in this way to thermal flow so that the resulting zones of the first layer of resin cover the isolation zones;

v) depositing a second layer of resin;

vi) performing plasma etching; and then vii) performing mechanical and chemical polishing.

BRIEF DESCRIPTION OF THE DRAWINGS

Other characteristics, objects, and advantages of the present invention will appear on reading the following detailed description and on referring to the accompanying drawings, given as non-limiting examples, and in which.

MORE DETAILED DESCRIPTION

As mentioned above, the present invention seeks to obtain almost perfect planeness over an entire semiconductor structure, regardless of the dimensions and the density of its patterns.

For this purpose, the present invention proposes using photolithography to apply different treatments to different zones of a resin layer depending on whether the zones overlie regions having high pattern density or low pattern density in the underlying semiconductor structure.

Figure 1:
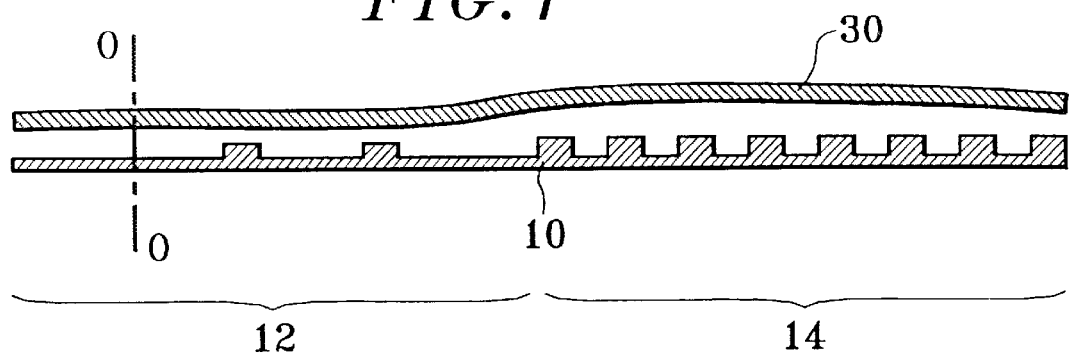
FIG. 1 is a diagram showing the dishing effect obtained over zones of low density, and conversely the polishing effect obtained over dense zones when implementing conventional mechanical and chemical polishing.
Figure 2A:
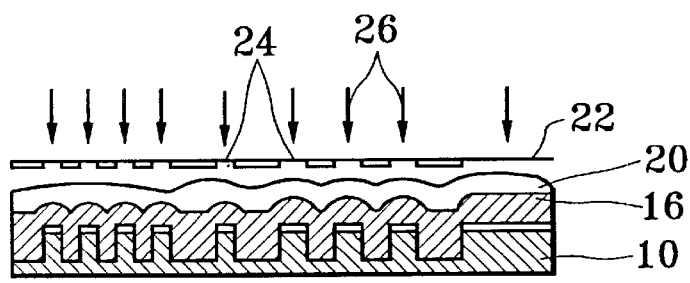
FIGS. 2a, 2b, and 2c show three successive main steps in a conventional process for pre-planarization by back-masking and direct etching.
Figure 2B:
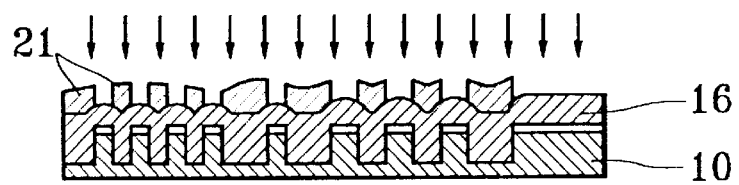
Figure 2C:
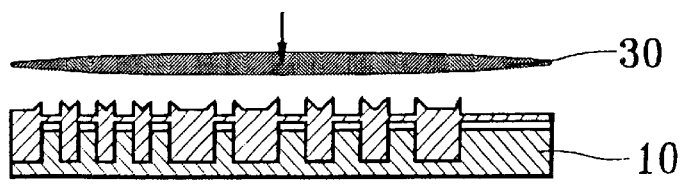
Figure 3A:
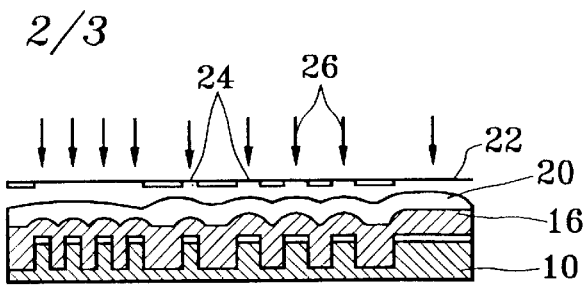
FIGS. 3a, 3b, 3c, and 3d show four successive main steps in a conventional process for pre-planarization by the two-layer technique with transfer of planeness by plasma etching prior to mechanical and chemical polishing.
Figure 3B:
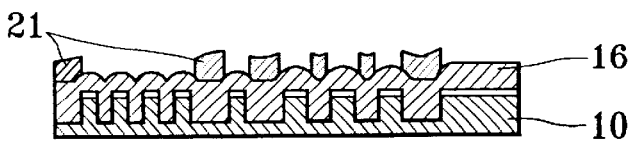
Figure 3C:
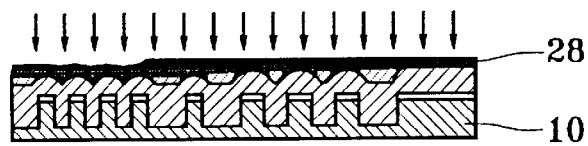
Figure 3D:
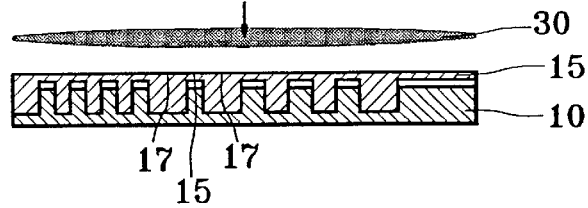
Figure 4A:
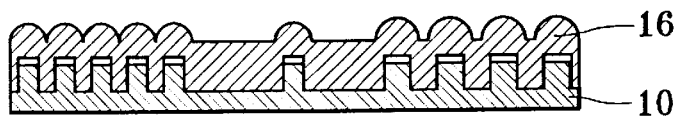
FIGS. 4a, 4b, 4c, 4d, and 4e are diagrams showing the structure obtained during the five successive steps of this process.
Figure 4B:
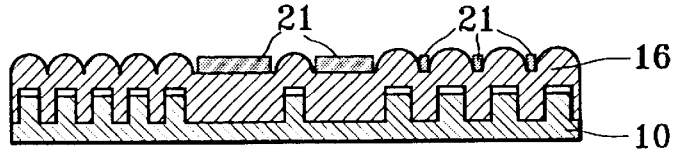
Figure 4C:
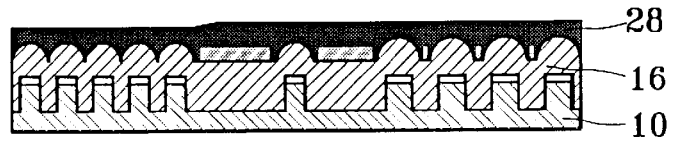
Figure 4D:
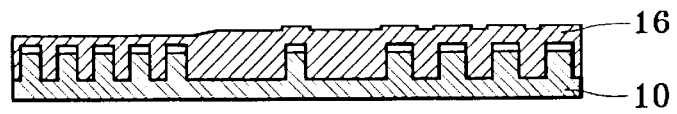
Figure 4E:
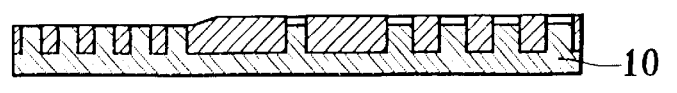
Figure 5A:
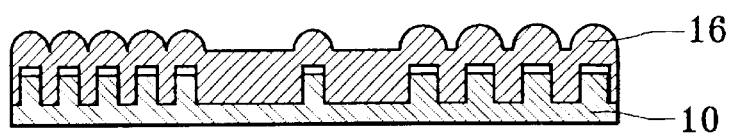
FIGS. 5a, 5b, 5c, 5d, and 5e are diagrams showing the structure obtained during the five successive steps of implementing the method of the present is invention.

FIG. 5a shows a substrate 10 having a layer in relief 16 prior to the planarization process.

In the context of the present invention, after depositing a first layer of resin 200 on the structure to be planarized, the zones thereof that are superposed over high density zones in the underlying topography are subjected to photolithography by means of a mask possessing a standard mesh, i.e. a mesh that does not coincide directly and specifically with the underlying topography.

It will be observed that this mask does not take any account of patterns of small size that are isolated.

However, the zones of the resin layer 200 that are superposed over low density zones of the semiconductor structure are subjected to photolithography via a mask that imposes resin patterns of a size that is smaller than the underlying isolation zones to be masked.

Figure 5B:
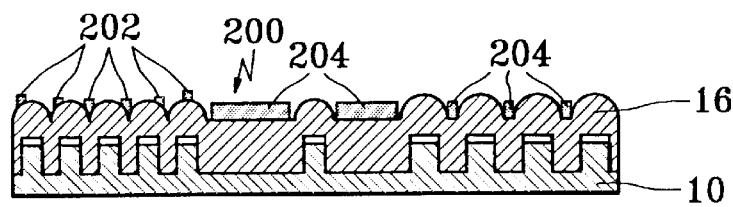
Figure 5C:
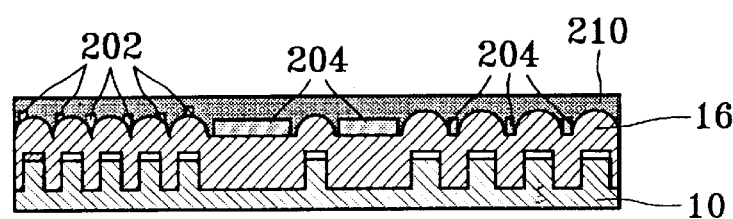

In FIG. 5b, reference 202 designates elements of the first resin layer 200 that result from photolithography using a mask with a standard mesh, and reference 204 designates those elements of the resin layer 200 that are superposed over zones of low topographical density.

The masks used for performing photolithography of the resin layer 200 respectively in register with the high density zones and in register with the low density zones of the topography can be constituted by a common mask or by distinct masks.

It will be observed that like the standard mesh mask, the mask used for photolithography over the zones of low topographical density is adapted to exclude the resin layer 200 from isolated topographical patterns of small size.

Preferably, in the context of the invention, the standard mesh mask has a grid of lines, e.g. at 45° to one another.

After complete photolithography of the first resin layer 200, this layer is preferably subjected to a thermal flow step so that the viscosity and the surface tension of the molten resin 200 and the underlying silica 16 cause the molten resin 202, 204 to run into the isolating zones.

Figure 6:
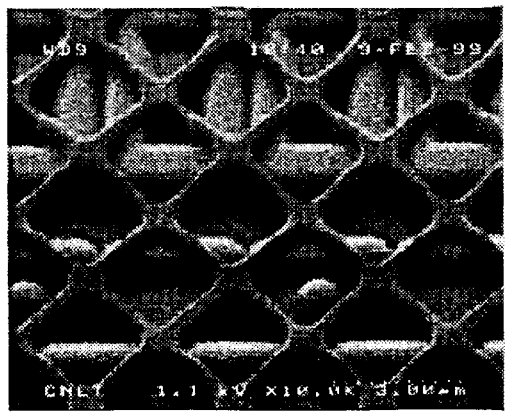
FIG. 6 shows the structure of the first resin layer after photolithography with a mask possessing a standard mesh.
Figure 7:
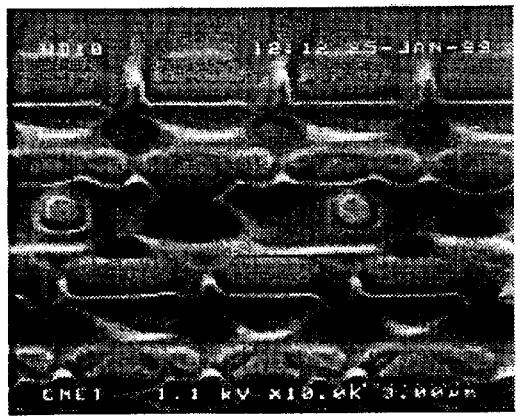
FIG. 7 shows a view of the same layer after it has been made to flow.

This can be seen particularly in FIGS. 6 and 7 which respectively show the resin layer 200 over zones having high-density topography respectively before and after thermal flow.

Figure 5D:
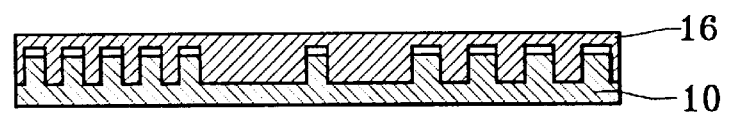
Figure 5E:
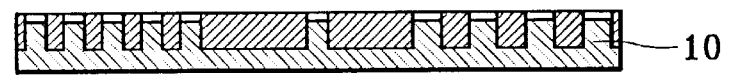

In the invention, a second layer of resin 210 is then deposited. This second layer 210 leads to almost perfect planeness which is then transferred to the underlying layer 16 by plasma etching and shown in FIG. 5d. Then all that remains to be done is conventional mechanical and chemical polishing so as to obtain an almost plane structure as shown in FIG. 5e.

The method of the present invention thus makes it possible to obtain excellent final planeness with residual topographical variations of less than 50 nm over the entire wafer.

The width of the lines of the standard mesh mask and their spacing can be obtained as a result of performing calculations concerning the filling of dense zones based on a planarization model of the kind mentioned in reference [2].

To planarize patterns of the STI type that are 0.2 $\mu$m wide and spaced apart by 0.3 $\mu$m, having a thickness of 0.4 $\mu$m, the grid of the mask can correspond to lines that are 0.5 $\mu$m wide and that are spaced apart by 2 $\mu$m.

In addition, the resin thickness can be fixed to a height of about 0.6 $\mu$m to 0.7 $\mu$m for STI patterns having a height of 0.4 $\mu$m to 0.5 $\mu$m.

The mask used for the photolithography of the resin layer 200 over the low density zones preferably presents a typical size reduction lying in the range 0.2 $\mu$m to 0.8 $\mu$m compared with the real underlying topography.

The lithography of the two masks applied to the first resin layer 200 is preferably performed successively on the photoreceiver to avoid wasting time realigning the wafer with the second mask.

It should also be observed that in the method of the present invention, the width of the grid lines formed in the layer of resin 200 is adjustable for a given mask depending on the height of the STI devices by using an isolation zone of greater or smaller area applied to the standard mesh mask, the mask superposed over the low density zones being preferably insolated under standard conditions.

This adjustment makes it possible to correct or replace computing the spacing for the grid lines for the purpose of optimizing filling of large dense zones in order to obtain almost perfect overall planeness.

It should also be observed that the method of the present invention makes it possible to use an "i.line" photoresistive resin, i.e. a photosensitive resin normally intended for patterns in 0.35 $\mu$m technology. This is possible because there are no small patterns in the back-mask.

Thus, the present invention makes "non-critical" implementation possible since it can be implemented using resin and equipment that are very conventional, with procedures that are much less difficult to implement and much less expensive than more recent technologies of the DUV type.

Naturally, the present invention is not limited to the particular embodiment described above, but extends to any variants within the spirit of the invention.

REFERENCES

[1] A. Schiltz and M. Pons, J. of the Electrochem. Soc., Vol. 133, 178 (1986).

[2] A. Schiltz, Jpn. J. Appl. Phys., Vol. 34, pp. 4185–4194 (1995).

What is claimed is:

1. A method of correcting topographical effects on a microelectronic substrate, the method comprising the steps consisting in:

i) depositing a first layer of resin on the structure to be planarized that has topography in relief surrounded by isolation zones;

ii) subjecting said resin layer in its zones superposed over underlying zones of low topographical density to photolithography by means of a mask imposing resin patterns of a size smaller than the underlying isolation zones to be masked;

iii) subjecting the resin layer in its zones superposed on underlying zones of high topographical density to photolithography through a mask possessing a standard mesh without any one-to-one coincidence with the underlying topography wherein said step iii) of photolithography through a mask possessing a standard mesh consists in adjusting the insolation to obtain optimum filling of large topographically dense zones;

iv) subjecting the first layer of resin as photo-lithographed in this way to thermal flow so that the resulting zones of the first layer of resin cover the isolation zones;

v) depositing a second layer of resin;

vi) performing plasma etching; and then vii) performing mechanical and chemical polishing.

2. A method according to claim 1, wherein steps ii) and iii) are performed using a common mask having zones dedicated respectively to the low density zones and to the high density zones of the underlying topography.

3. A method according to claim 1, wherein steps ii) and iii) are performed using distinct masks.

4. A method according to claim 1, wherein the mask-forming means are adapted to exclude the resin layer from isolated isolation zone patterns of small dimensions.

5. A method according to claim 1, wherein the mask-forming means used in step iii) have a grid of lines.

6. A method according to claim 1, wherein the mask-forming means used in step iii) have grid lines at 45° to one another.

7. A method according to claim 1, wherein the mask-forming means have lines with a thickness of 0.5 $\mu$m that are spaced apart by 2 $\mu$m.

* * * * *